United States Patent
Zhang (10) Patent No.: US 7,864,915 B2
(45) Date of Patent: Jan. 4, 2011

(54) LOW-POWER ASYNCHRONOUS COUNTER AND METHOD

(75) Inventor: Gang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 12/247,970

(22) Filed: Oct. 8, 2008

(65) Prior Publication Data

US 2010/0085220 A1    Apr. 8, 2010

(51) Int. Cl.
   *H03K 23/50*    (2006.01)
(52) U.S. Cl. ......................................... 377/119; 377/37
(58) Field of Classification Search .................. None
   See application file for complete search history.

(56) References Cited

U.S. PATENT DOCUMENTS

| | | | |
|---|---|---|---|
| 3,805,031 A | | 4/1974 | Leibowitz et al. |
| 4,144,525 A | * | 3/1979 | O'Neill ........................ 341/156 |
| 5,060,243 A | * | 10/1991 | Eckert ........................... 377/28 |
| RE34,810 E | * | 12/1994 | Lemaine et al. ............. 348/472 |
| 6,163,209 A | * | 12/2000 | Myers .......................... 329/316 |
| 7,495,597 B2 | * | 2/2009 | Muramatsu et al. ......... 341/164 |
| 2007/0041487 A1 | * | 2/2007 | Khanoyan ..................... 377/48 |

FOREIGN PATENT DOCUMENTS

EP    0464592    1/1992

OTHER PUBLICATIONS

Divide-By-2, 4, 8 ,16 and 32 with Synchronized Outputs in a Phase Locked Loop IBM Technical Disclosure Bulletin, US, vol. 37, No. 12, Dec. 1, 1994, pp. 335-337, XP000487808.
International Search Report and Written Opinion—PCT/US09/060063, International Searching Authority—European Patent Office, Dec. 23, 2009.

* cited by examiner

*Primary Examiner*—Cassandra Cox
(74) *Attorney, Agent, or Firm*—Jiayu Xu (57) ABSTRACT

Design techniques for a low-power asynchronous counter. In an exemplary embodiment, the clock inputs and signal outputs of a plurality of flip-flops are serially concatenated to implement an asynchronous counting mechanism. The signal outputs of the plurality of flip-flops are sampled by successively delayed versions of a reference signal. Further design techniques for generating successively delayed versions of the reference signal are disclosed. In an exemplary embodiment, the asynchronous counting techniques may be utilized in a high-speed counter for a digital-phase locked loop (DPLL).

29 Claims, 9 Drawing Sheets

LOW-POWER ASYNCHRONOUS COUNTER AND METHOD

TECHNICAL FIELD

The disclosure relates to techniques for phase accumulation in a digital phase-locked loop (DPLL).

BACKGROUND

In modern communications circuitry, digital phase-locked loops (DPLL's) are used to generate output signals having arbitrary frequency by phase locking to a reference signal having a known frequency. To measure the accumulated digital phase of an output signal, the DPLL may employ a counter combined with a time-to-digital converter (TDC). The counter may count the integer portion of the accumulated phase in cycles of the output signal, while the TDC may measure the fractional portion of the accumulated phase.

In conventional DPLL designs, the counter is usually implemented as a synchronous mechanism wherein, e.g., a plurality of D-Q flip-flops is synchronously sampled at every rising edge of the DPLL output signal. Because the DPLL output signal may be a high-frequency signal, this synchronous mechanism may consume a correspondingly high level of power.

It would be desirable to provide a novel DPLL counter design that consumes less power than prior art synchronous counters, while being robust and simple to design.

SUMMARY

An aspect of the present disclosure provides a method for generating a digital representation of a number of elapsed cycles of an input signal, the method comprising: sampling a first D signal on a triggering event of the input signal to generate a first Q signal and a first complementary Q signal, the first complementary Q signal being coupled to the first D signal; sampling a second D signal on a triggering event of the first complementary Q signal to generate a second Q signal and a second complementary Q signal, the second complementary Q signal being coupled to the second D signal; sampling the first Q signal on a triggering event of a reference signal to generate a first bit of the digital representation of the number of elapsed cycles of the input signal; and sampling the second Q signal on a triggering event of a first delayed version of the reference signal to generate a second bit of the digital representation of the number of elapsed cycles of the input signal.

Another aspect of the present disclosure provides an apparatus for generating a digital representation of a number of elapsed cycles of an input signal, the apparatus comprising: a first signal sampler configured to sample a first D signal on a triggering event of the input signal to generate a first Q signal and a first complementary Q signal, the first complementary Q signal being coupled to the first D signal; a second signal sampler configured to sample a second D signal on a triggering event of the first complementary Q signal to generate a second Q signal and a second complementary Q signal, the second complementary Q signal being coupled to the second D signal; a first auxiliary signal sampler configured to sample the first Q signal on a triggering event of a reference signal to generate a first bit of the digital representation of the number of elapsed cycles of the input signal; and a second auxiliary signal sampler configured to sample the second Q signal on a triggering event of a first delayed version of the reference signal to generate a second bit of the digital representation of the number of elapsed cycles of the input signal.

Yet another aspect of the present disclosure provides an apparatus for generating a digital representation of a number of elapsed cycles of an input signal, the apparatus comprising: counting means for asynchronously counting the number of elapsed cycles of an input signal; and sampling means for sampling the counting means with the appropriate delays to generate the digital representation of the number of elapsed cycles of the input signal.

Yet another aspect of the present disclosure provides a computer program product for generating a digital representation of a number of elapsed cycles of an input signal, the product comprising: computer-readable medium comprising: code for causing a computer to sample a first D signal on a triggering event of the input signal to generate a first Q signal and a first complementary Q signal, the first complementary Q signal being coupled to the first D signal; code for causing a computer to sample a second D signal on a triggering event of the first complementary Q signal to generate a second Q signal and a second complementary Q signal, the second complementary Q signal being coupled to the second D signal; code for causing a computer to sample the first Q signal on a triggering event of a reference signal to generate a first bit of the digital representation of the number of elapsed cycles of the input signal; and code for causing a computer to sample the second Q signal on a triggering event of a first delayed version of the reference signal to generate a second bit of the digital representation of the number of elapsed cycles of the input signal.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
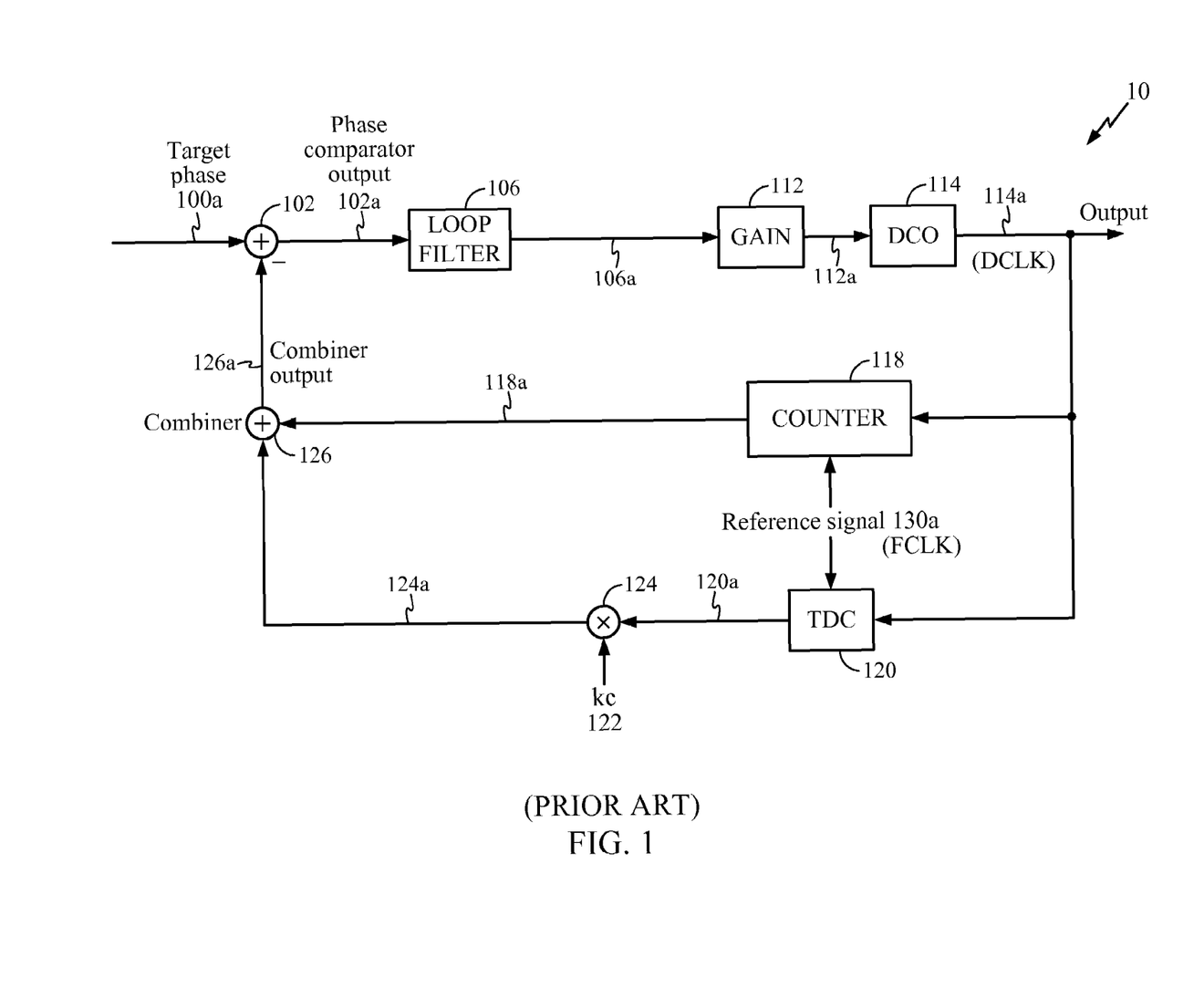
FIG. 1 depicts an implementation of a prior art DPLL 10.

FIG. 1 depicts an implementation of a prior art DPLL 10. The DPLL 10 includes a digital phase comparator 102, digital loop filter 106, digitally controlled oscillator (DCO) 114, a counter 118, a time-to-digital converter (TDC) 120, a calibration multiplier 124, and a combiner 126.

During operation, the DCO 114 generates an output signal 114a having a frequency controlled by a digital input signal 112a. The output signal 114a, also denoted DCLK, and a reference signal 130a, also denoted FCLK, are simultaneously provided to the counter 118 and the TDC 120. In general, the frequency of the reference signal 130a may be lower than the frequency of the output signal 114a. The counter 118 and TDC 120 may be configured to periodically measure the cumulative number of cycles of DCO output signal 114a elapsed since a reference time, with the counter 118 counting the integer portion of the elapsed number of cycles, and the TDC 120 measuring the residual fractional portion. The TDC output signal 120a is further multiplied 124 by a calibration factor kc 122, before being combined 126 with the counter output 118a to form the combiner output signal 126a. The combiner output signal 126a represents the measured accumulated phase of the DCO output signal 114a.

In FIG. 1, the combiner output signal 126a is compared 102 to an accumulated target phase 100a to generate a phase comparator output 102a, which is then provided to a loop filter 106. The loop filter output 106a is provided to a gain element 112 to generate the signal 112a, which is in turn provided to control the frequency of the DCO output signal 114a.

One of ordinary skill in the art will appreciate that the DPLL 10 generates an output signal 114a that is phase-locked to the reference signal 130a.

Note the prior art implementation of the DPLL 10 in FIG. 1 is shown for illustrative purposes only. One of ordinary skill in the art will appreciate that the techniques of the present disclosure may readily be applied to alternative DPLL architectures not shown. For example, DPLL 10 may incorporate additional filtering or gain elements not shown in FIG. 1. Furthermore, DPLL 10 may incorporate further elements for modulating the frequency, amplitude, or phase of the DCO output signal using, e.g., two-point modulation techniques well-known in the art. Such exemplary embodiments are contemplated to be within the scope of the present disclosure.

Figure 2:
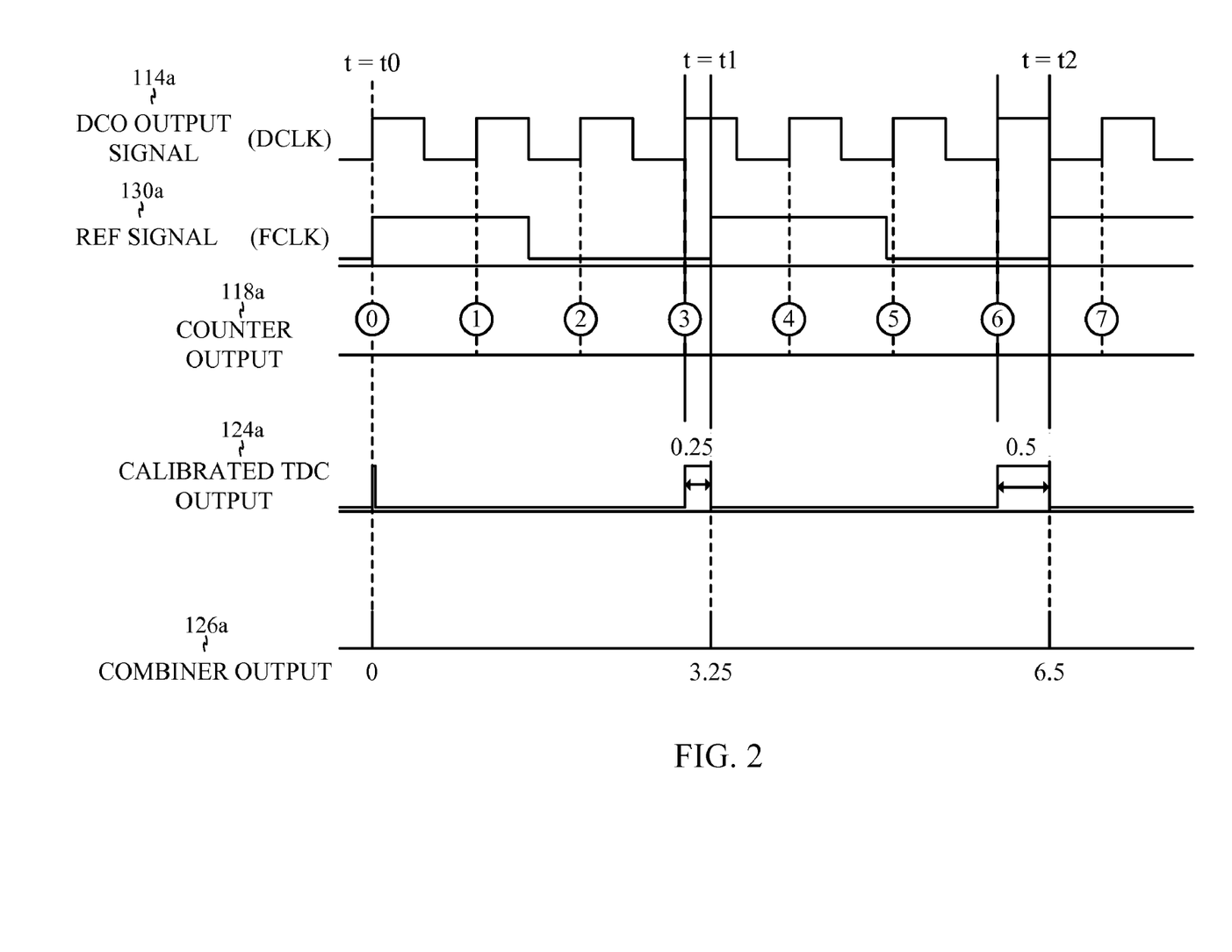
FIG. 2 illustrates an instance of logical signals present in the DPLL 10 during operation.

FIG. 2 illustrates an instance of logical signals present in the DPLL 10 during operation. In FIG. 2, an instance of DCO output signal 114a, or DCLK, is shown along with an instance of reference signal 130a, or FCLK. The counter output signal 118a indicates the cumulative integer number of cycles of DCLK elapsed since a reference time t=t0. Meanwhile, calibrated TDC output signal 124a is seen to indicate, on each rising edge of FCLK, the time (expressed in cycles of signal 114a) elapsing between that rising edge of FCLK and the immediately preceding rising edge of DCLK. The combiner output signal 126a is generated on the rising edges of FCLK by combining the counter output signal 118a with the calibrated TDC output signal 124a.

For example, at time t=t1, the counter output signal 118a has a value of 3, and the calibrated TDC output signal 124a has value of 0.25, combining to generate a total accumulated phase of 3.25 cycles for the combiner output signal 126a. Similarly, at time t=t2, the counter output signal 118a has a value of 6, and the calibrated TDC output signal 124a has a value of 0.5, combining to generate a total accumulated phase of 6.5 cycles for the combiner output signal 126a.

Note one of ordinary skill in the art will appreciate that the combiner output signal 126a and other signals shown in FIGS. 1 and 2 may generally be expressed in arbitrary units, and the scope of the present disclosure is not limited to any particular units used. For example, the signal 126a may be expressed in cycles of FCLK, or as a scaled version of any units shown or not shown in FIG. 2. Such exemplary embodiments are contemplated to be within the scope of the present disclosure.

Note the signals in FIG. 2 are shown for illustration only, and are not meant to restrict the scope of the present disclosure to any particular relationship of DCLK to FCLK shown. For example, in alternative exemplary embodiments (not shown), the relative frequency of DCLK and FCLK may be different from that shown. Such exemplary embodiments are contemplated to be within the scope of the present disclosure.

Figure 3:
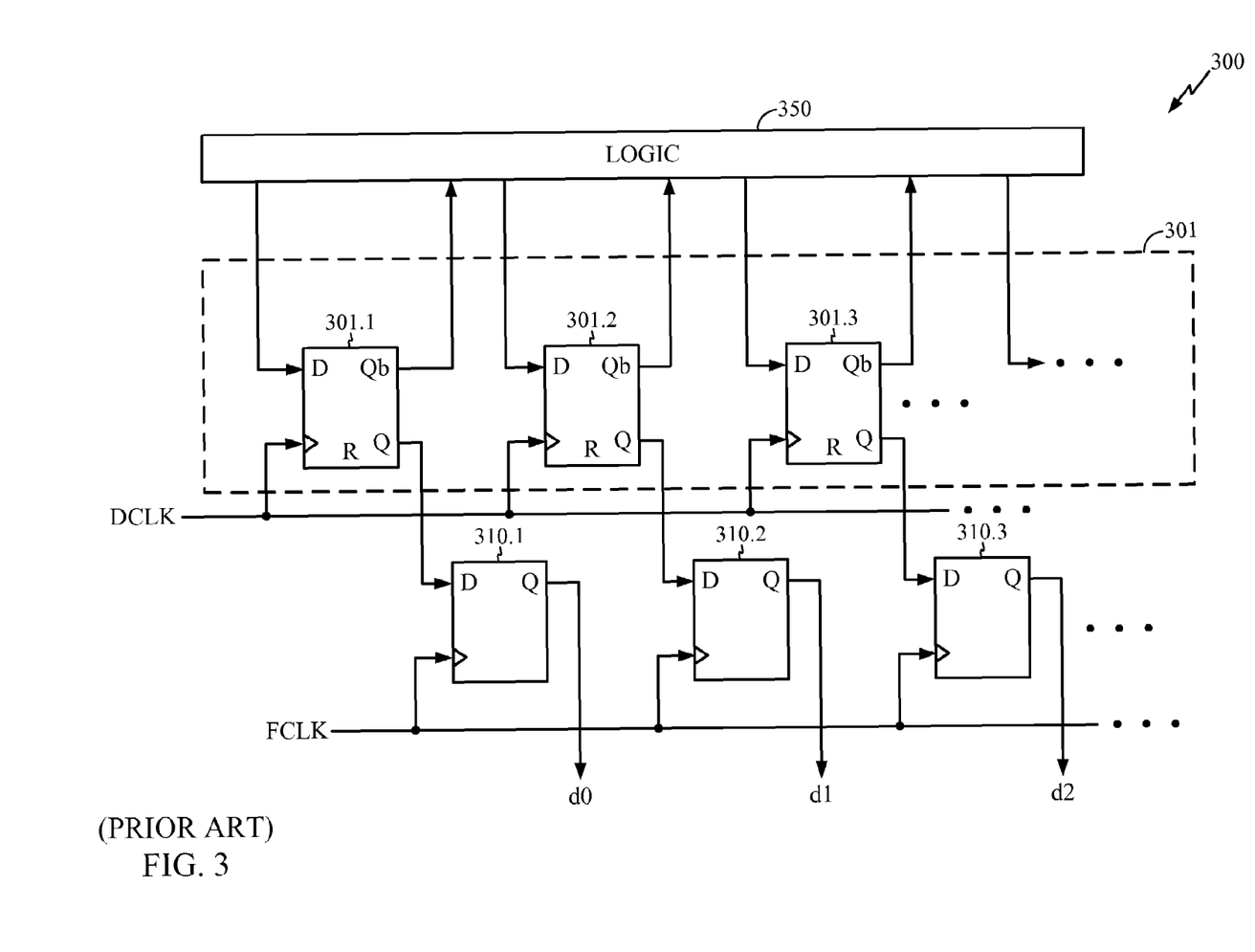
FIG. 3 depicts an example of a prior art counter implementation 300 for counter 118 in the DPLL 10 of FIG. 1.

FIG. 3 depicts an example of a prior art counter implementation 300 for counter 118 in the DPLL 10 of FIG. 1. In FIG. 3, the counter 300 outputs a plurality of bits d0, d1, d2, etc., that form a binary representation of the number of cycles elapsed in DCLK since a given time. To derive these bits, a plurality of D-Q flip-flops 301 and a logic module 350 are configured to keep a running tally of the number of cycles elapsed in DCLK. Each D-Q flip-flop within the plurality of flip-flops 301 may be denoted by a reference numeral 301.$n$, wherein the variable n is generally an index to each instance of an element within a plurality of such elements. In particular, D-Q flip-flops 301 are configured as counter flip-flops whose Q outputs collectively represent, in binary notation, the number of elapsed cycles of DCLK at any time. Logic module 350 is configured to increment the output bits of D-Q flip-flops 301.

In the exemplary embodiment shown, logic module 350 inputs the Qb (inverted) outputs of D-Q flip-flops 301, determines the corresponding value of the Q (non-inverted) outputs, and increments that value, e.g., by one. Logic module 350 provides the incremented value back to the D inputs of flip-flops 301, to be synchronously sampled on the next rising edge of DCLK. In particular, the signal DCLK is provided to the CLK inputs (conventionally marked as a sideways triangle for each flip-flop) of flip-flops 301. Similarly, the Q outputs of flip-flops 301 are synchronously sampled on the rising edge of FCLK by D-Q flip-flops 310 to generate the bits d0, d1, d2, etc.

Figure 4:
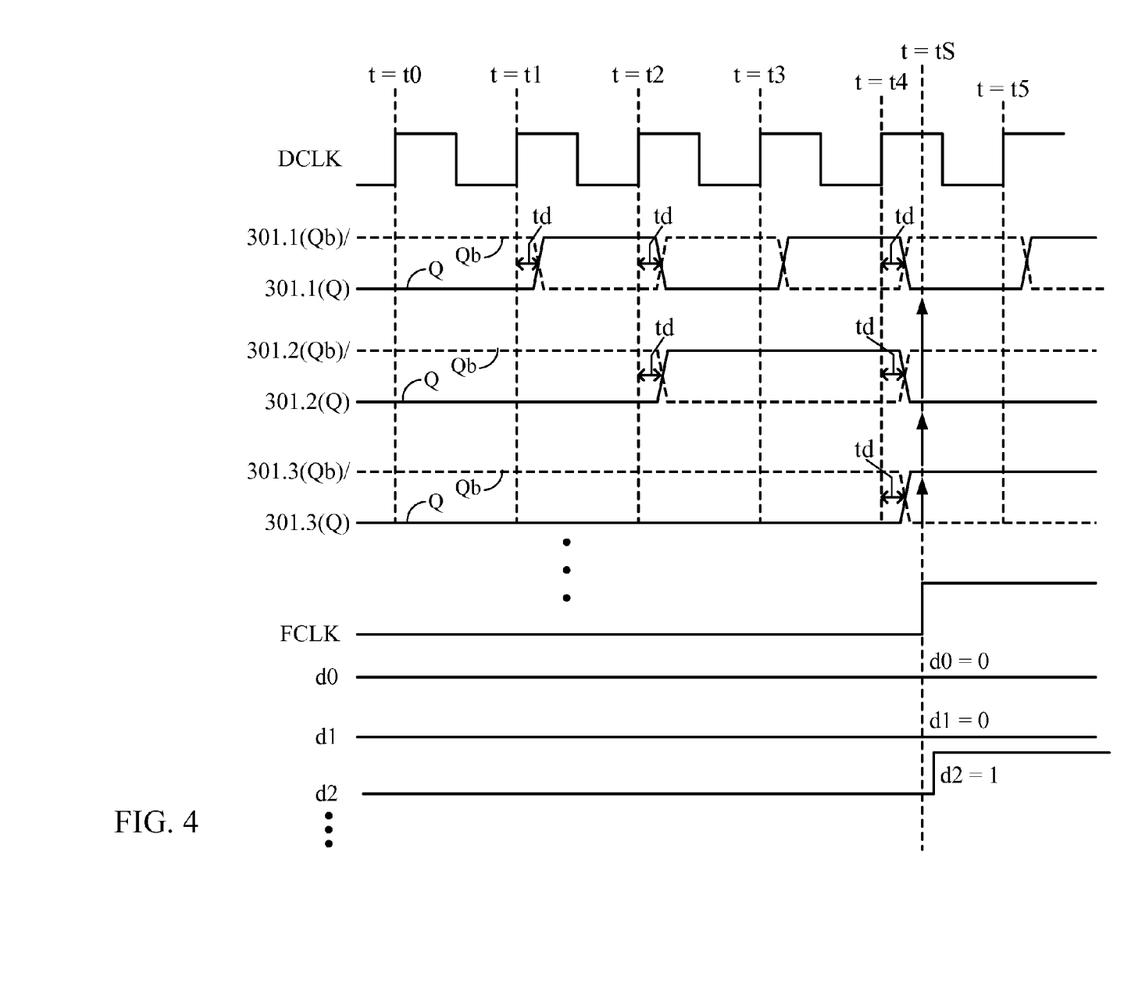
FIG. 4 illustrates an instance of logical signals present in the prior art counter implementation 300 shown in FIG. 3.

FIG. 4 illustrates an instance of logical signals present in the prior art counter implementation 300 shown in FIG. 3. In FIG. 4, the D inputs of all D-Q flip-flops 301, including 301.1, 301.2, and 301.3, are sampled on the succeeding rising edges of DCLK to generate outputs Q/Qb for each flip-flop. For example, at time t=t1, the corresponding rising edge of DCLK generates values of 0/1 for 301.1(Q)/301.1(Qb), 0/1 for 301.2 (Q)/301.2(Qb), and 0/1 for 301.3(Q)/301.3(Qb). At time t=t2, the corresponding rising edge of DCLK samples values of 1/0 for 301.1(Q)/301.1(Qb), 0/1 for 301.2(Q)/301.2(Qb), and 0/1 for 301.3(Q)/301.3(Qb). Note that after the flip-flops 301 are synchronously sampled on the rising edge of DCLK, all Q/Qb outputs are generally available at approximately the same time, i.e., by a pre-specified clock-to-output time td after the rising edge of DCLK. Subsequently, the Q/Qb outputs of the D-Q flip-flops 301 are synchronously sampled on the rising edge of FCLK using flip-flops 310 to generate bits d0, d1, d2. For example, at time t=tS, the corresponding rising edge of FCLK samples values of 0/0/1 for outputs d0/d1/d2.

One of ordinary skill in the art will appreciate that, in the synchronous counter implementation 300 depicted in FIG. 3, the signal DCLK is required to drive the D input of each flip-flop 301.$n$ in the plurality of flip-flops 301. As DCLK may generally be a high-frequency signal, the power consumed in driving the D inputs of all D-Q flip-flops 301 on every cycle of DCLK may be correspondingly high. This power consumption may be wasteful as the counter output d0, d1, d2, etc. may only be sampled by the DPLL once per cycle of the relatively slow reference signal FCLK.

Figure 5:
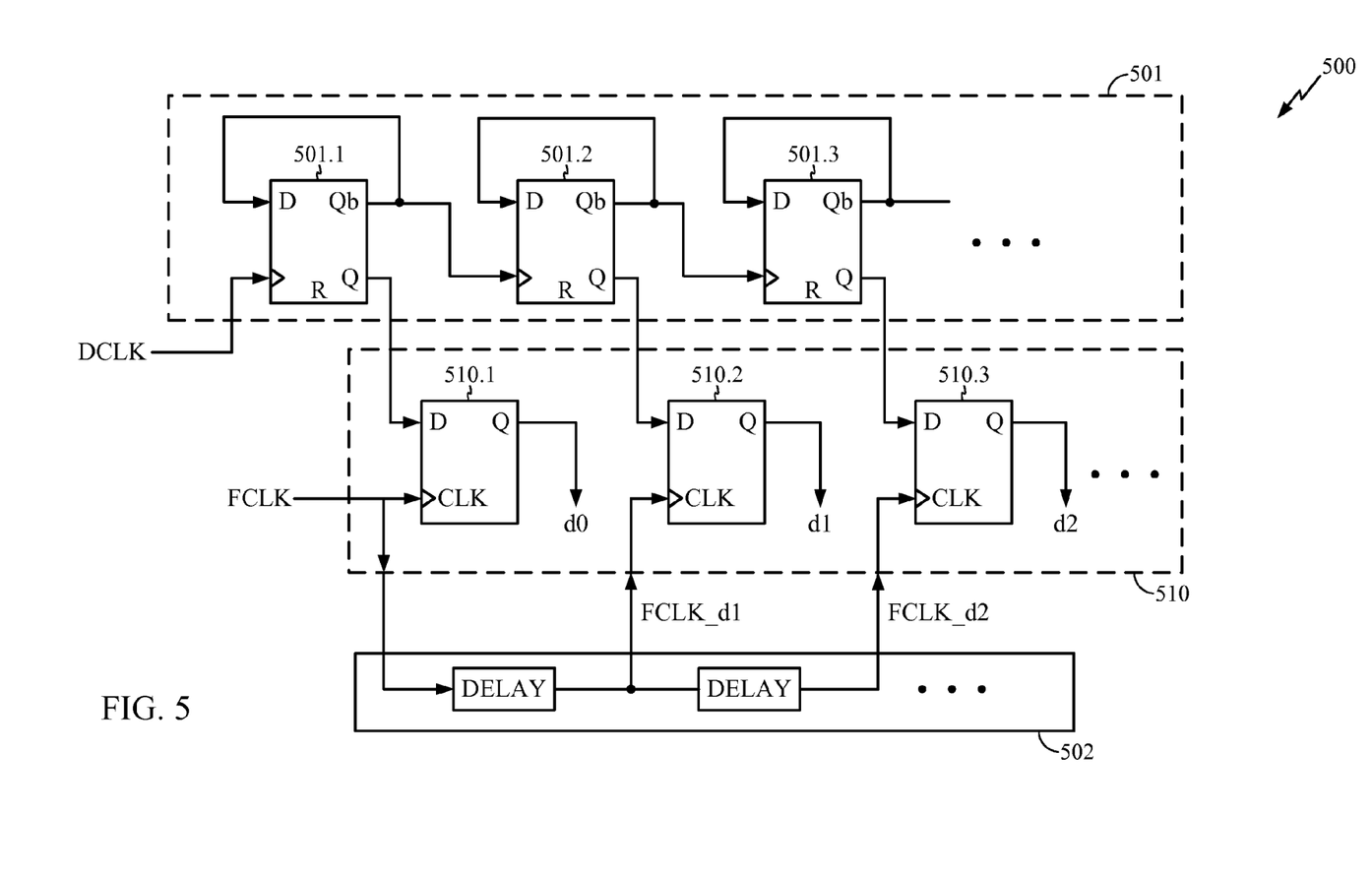
FIG. 5 depicts an exemplary embodiment 500 of an asynchronous counter according to the present disclosure.

FIG. 5 depicts an exemplary embodiment 500 of an asynchronous counter according to the present disclosure. In FIG. 5, flip-flops 501 are concatenated in series, with the CLK input of the first flip-flop 501.1 being directly coupled to DCLK, and the Qb output signal of each flip-flop 501.$n$ being coupled to the CLK input of the immediately succeeding flip-flop 501.(n+1). Furthermore, the Qb output signal of each flip-flop 501.$n$ is fed back to the D input of the same flip-flop. Meanwhile, the Q output signal of each flip-flop 501.$n$ is coupled to the D input of a corresponding flip-flop 510.$n$ in a plurality of flip-flops 510. The flip-flops 510 are clocked by successively delayed versions FCLK_d1, FCLK_d2, etc., of FCLK. In the exemplary embodiment shown, the delayed versions of FCLK are generated by a delay module 502.

One of ordinary skill in the art will appreciate that the coupling of the Qb output of each flip-flop 501.$n$ back to the D input of the same flip-flop causes the Q output of each flip-flop to toggle at the frequency of its corresponding CLK input. By further coupling the Qb output of each flip-flop 501.$n$ to the CLK input of the succeeding flip-flop 501.(n+1), one of ordinary skill in the art will appreciate that the operation of binary incrementation is achieved using the configuration of flip-flops 501 shown.

Figure 6:
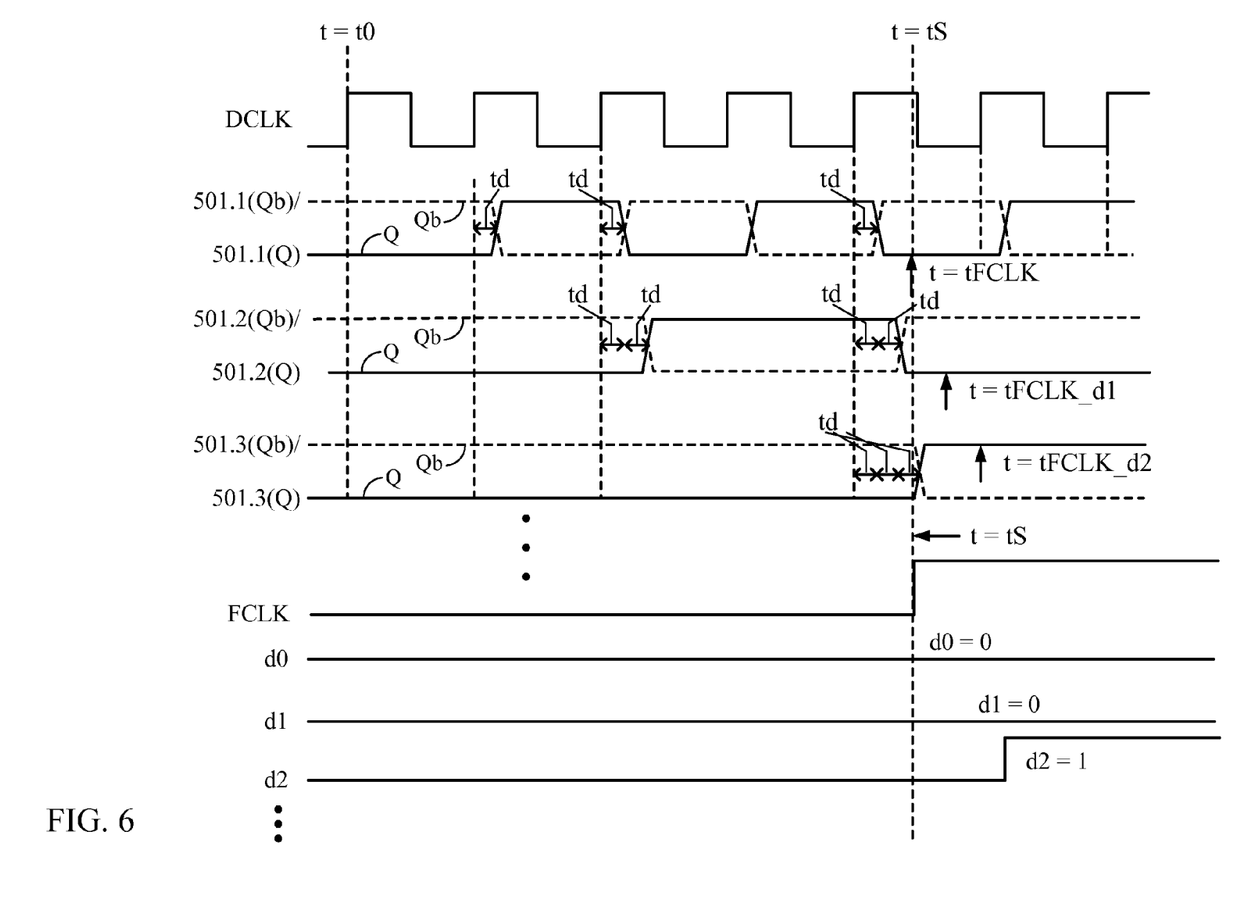
FIG. 6 depicts an instance of logical signals present in the exemplary asynchronous counter implementation 500 shown in FIG. 5.

To illustrate the functionality of flip-flops 501, FIG. 6 depicts an instance of logical signals present in the exemplary asynchronous counter implementation 500 shown in FIG. 5. In FIG. 6, the complementary outputs 501.1(Q)/501.1(Qb) of the first flip-flop 501.1 are shown to be toggled on every rising edge of DCLK, due to the fact that output 501.1(Qb) is coupled back to the input 501.1(D) of flip-flop 501.1. The outputs 501.1(Q)/501.1(Qb) are generally available at a pre-specified clock-to-output time td after the rising edge of the sampling signal DCLK. Meanwhile, the D input to the subsequent flip-flop 501.2, which is derived from the feedback signal 501.2(Qb), is sampled on the rising edges of signal 501.1(Qb) to generate complementary outputs 501.2(Q)/501.2(Qb). The outputs 501.2(Q) and 501.2(Qb) are generally available a time td after the rising edge of the sampling signal 501.1(Qb), or equivalently, 2*td after the rising edge of DCLK. Similarly, the D input to each subsequent flip-flop 501.$n$ is generally sampled on the rising edges of the signal 501.(n−1)(Qb) to generate complementary outputs 501.$n$(Q)/501.$n$(Qb). In general, due to the delay present in the asynchronous sampling mechanism of flip-flops 501, the outputs 501.$n$(Q)/501.$n$(Qb) of each flip-flop 501.$n$ are available at an approximate interval n*td after each rising edge of DCLK.

Note for the asynchronous counter 500, the signal DCLK need only drive the clock input of a single flip-flop 501.1, with the clock inputs for the rest of the flip-flops 501.$n$ (n≠1) being derived from the Qb outputs of the immediately preceding flip-flop. This is in contrast to the synchronous counter 300 shown in FIG. 3, wherein the signal DCLK is required to drive all CLK inputs of the plurality of flip-flops 301. As the frequency of the Qb output signal of each flip-flop 501.$n$ is at most equal to the frequency of DCLK, and generally less than the frequency of DCLK, the flip-flops 501 can be seen to consume less power than plurality of flip-flops 301 in the prior art counter implementation 300 depicted in FIG. 3. Furthermore, a separate logic module 350 is not necessary for the counter 500, as the incrementing logic is built directly into the configuration of the flip-flops 501, as earlier described.

As described above, due to the asynchronous nature of the plurality of flip-flops 501, the output signals of flip-flops 501.$n$ are available for sampling at varying delays relative to the rising edge of DCLK. FIGS. 5 and 6 further illustrate the asynchronous sampling of the outputs of flip-flops 501 using a delay module 502. In FIG. 5, the flip-flop 510.1, whose D input is coupled to the Q output signal of flip-flop 501.1, is sampled at time t=tFCLK on the rising edge of reference signal FCLK to generate the first output bit d0. The flip-flop 510.2, whose D input is coupled to the Q output signal of flip-flop 501.2, is sampled at time t=tFCLK_d1 by a delayed version FCLK_d1 of FCLK to generate the second output bit d1. Similarly, the flip-flop 510.3, whose D input is coupled to the Q output signal of flip-flop 501.3, is sampled at time t=tFCLK_d2 by a delayed version FCLK_d2 of FCLK to generate the output bit d2. FIG. 6 shows the timing of these signals. One of ordinary skill in the art will appreciate that the techniques disclosed may be applied to construct an asynchronous counter that accommodates an arbitrary number of output bits.

As described with reference to FIGS. 5 and 6, the delay module 502 may be configured to delay the FCLK signal by successively increasing amounts to ensure that the D input signals to flip-flops 510.$n$ are sampled only after they have had adequate time to settle. In an exemplary embodiment, to sample the D input of a flip-flop 510.$n$, the FCLK signal is delayed by a pre-computed interval n*td_max plus some margin, wherein td_max represents the maximum of the clock-to-output times of all flip-flops 501.$n$ in the plurality of flip-flops. One of ordinary skill in the art will appreciate that an appropriate value for td_max may be determined from, e.g., computer circuit simulation and/or other techniques.

Figure 7:
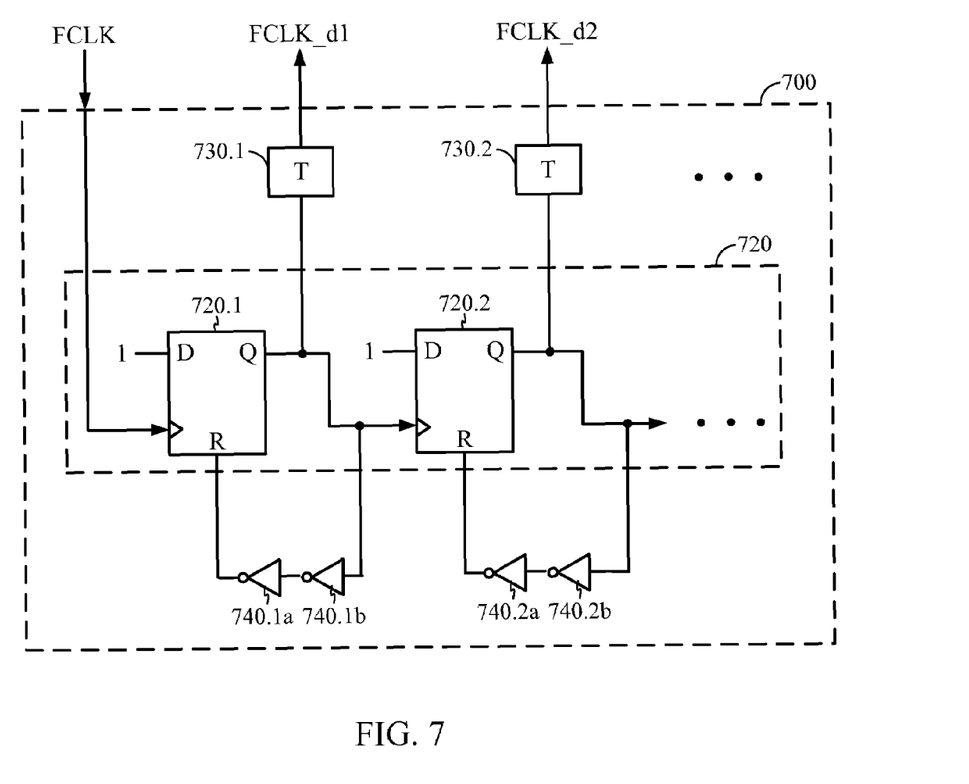
FIG. 7 depicts an exemplary embodiment 700 of the delay module 502 depicted in FIG. 5 implemented using signal path delay matching techniques.

To avoid the need to pre-compute the value of the parameter td_max as described above, and to increase the robustness of the asynchronous counter design, the delay module 502 may be implemented using signal path delay matching techniques according to a further aspect of the present disclosure. FIG. 7 depicts an exemplary embodiment 700 of the delay module 502 depicted in FIG. 5 implemented using such signal path delay matching techniques. In FIG. 7, the delay module 700 incorporates a plurality of flip-flops 720 coupled in series, wherein the delay characteristics of the flip-flops 720 are designed to match those of the corresponding flip-flops 501 in the asynchronous counter 500. The Q output of each flip-flop 720.$n$ is coupled to the CLK input of the immediately succeeding flip-flop 720.(n+1). The Q output of each flip-flop 720.$n$ is further coupled to the Reset (R) input of the same flip-flop 720.$n$ via a delay. In FIG. 7, the delay is generated by two series-coupled inverters 740.$na$ and 740.$nb$.

The Q output of each flip-flop 720.$n$ is further coupled to a fixed-delay element 730.$n$, which delays the corresponding Q output by a delay T. The output of each fixed-delay element 730.$n$ may be provided as a successively delayed version of FCLK generated by the delay module 502. For example, the output of delay element 730.2 may be provided as FCLK_d1, as shown in FIG. 7, while the output of delay element 730.3 may be provided as FCLK_d2.

Figure 8:
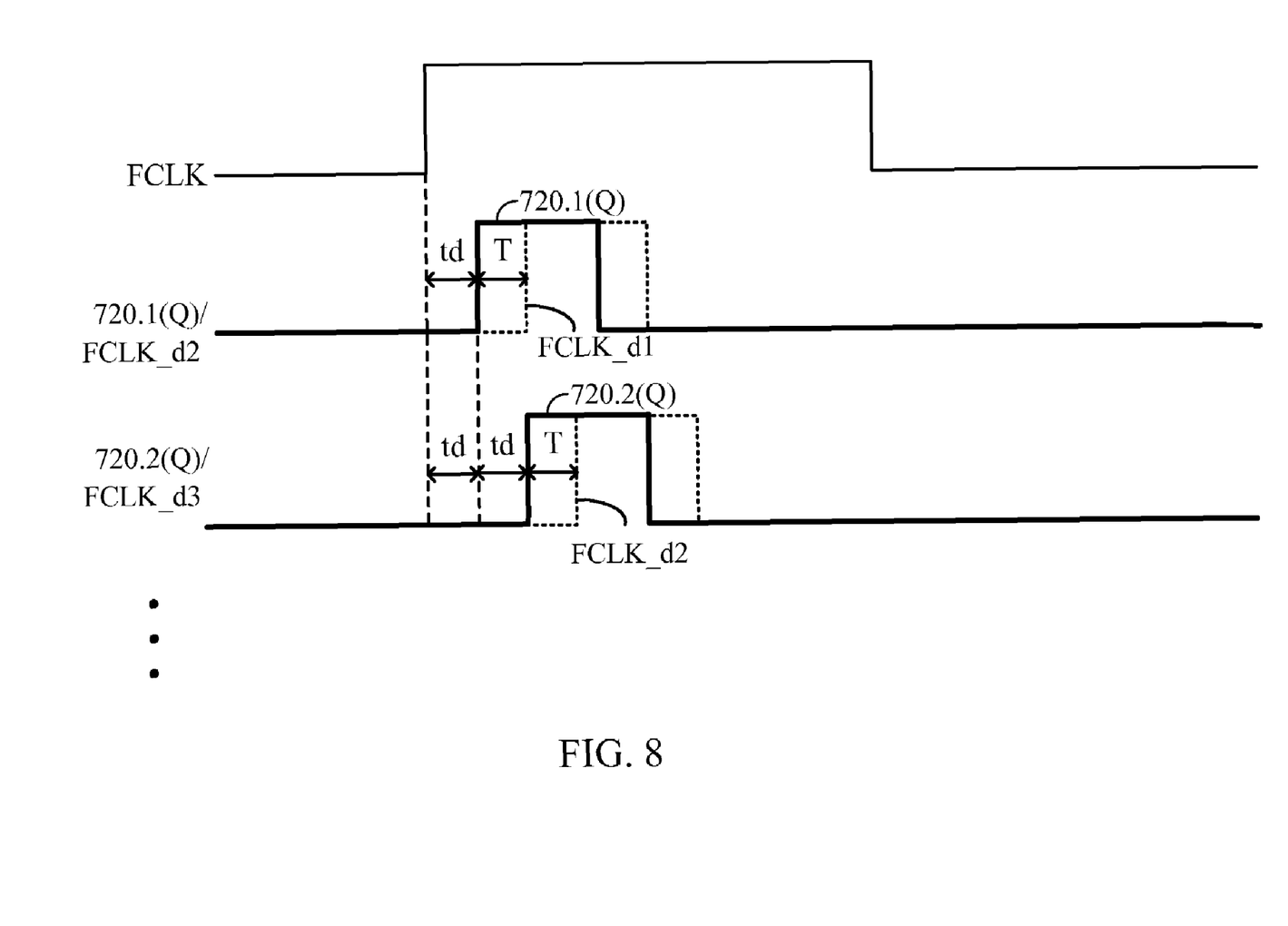
FIG. 8 illustrates an instance of logical signals present in the exemplary delay module 700 shown in FIG. 7.

FIG. 8 illustrates an instance of logical signals present in the exemplary delay module 700 shown in FIG. 7. In FIG. 8, a rising edge in the Q output signal of flip-flop 720.1 is seen to follow a corresponding rising edge in the reference signal FCLK by an approximate delay td. The Q output signal of flip-flop 720.1 is further delayed by an interval T to generate the signal FCLK_d1. Similarly, a rising edge in the Q output signal of the next flip-flop 720.2 is seen to follow the rising edge in the Q output signal of flip-flop 720.1 by an approximate delay td. The Q output signal of flip-flop 720.2 is further delayed by an interval T to generate the signal FCLK_d2.

In an exemplary embodiment, the interval T may be chosen to allow sampling of the flip-flops 510.$n$ with an adequate timing margin to allow settling of the output signals of the flip-flops 501 in counter 500.

Figure 9:
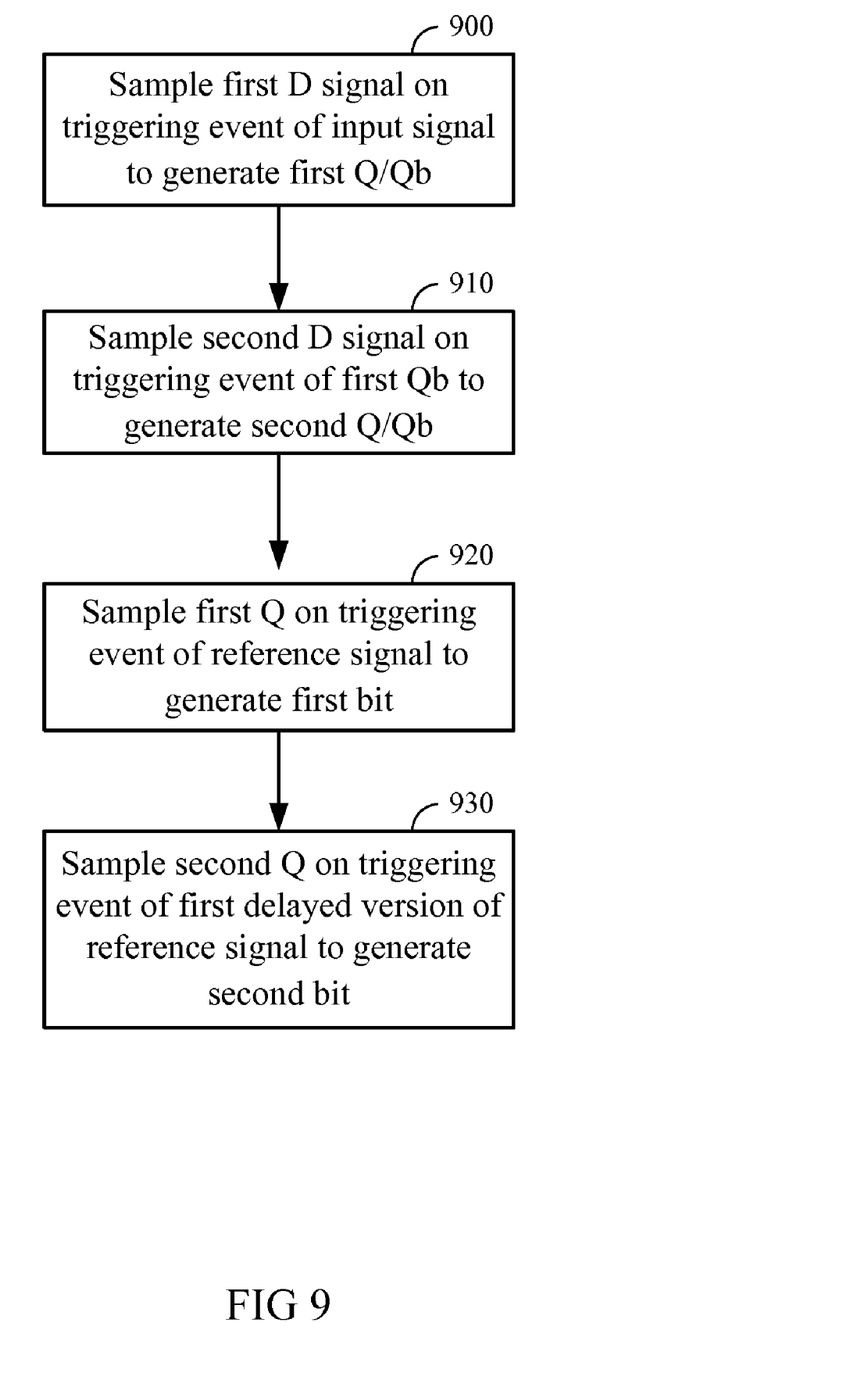
FIG. 9 depicts an exemplary embodiment of a method according to the present disclosure.

FIG. 9 depicts an exemplary embodiment of a method according to the present disclosure. Note the method is shown for illustrative purposes only, and is not meant to restrict the scope of the present disclosure to any particular method explicitly disclosed.

In FIG. 9, at step 900, the method samples a first D signal on a triggering event of the input signal to generate first Q/Qb outputs.

At step 910, the method samples a second D signal on a triggering event of the first Qb output to generate second Q/Qb outputs.

At step 920, the method samples the first Q output on a triggering event of the reference signal to generate a first bit of the digital representation of a number of elapsed cycles of an input signal.

At step 930, the method samples the second Q output on a triggering event of the first delayed version of reference signal to generate a second bit of the digital representation.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. A method for generating a digital representation of a number of elapsed cycles of an input signal, the method comprising:
   sampling a first D signal on a triggering event of the input signal to generate a first Q signal and a first complementary Q signal, the first complementary Q signal being coupled to the first D signal;
   sampling a second D signal on a triggering event of the first complementary Q signal to generate a second Q signal and a second complementary Q signal, the second complementary Q signal being coupled to the second D signal;
   sampling the first Q signal on a triggering event of a reference signal to generate a first bit of the digital representation of the number of elapsed cycles of the input signal; and
   sampling the second Q signal on a triggering event of a first delayed version of the reference signal to generate a second bit of the digital representation of the number of elapsed cycles of the input signal,
   wherein the input signal is an output signal of a digitally-controlled oscillator (DCO) in a digital phase-locked loop, the number of elapsed cycles representing the integer portion of an accumulated phase of the DCO output signal.

2. The method of claim 1, further comprising, for a plurality of bits in the digital representation of the number of cycles of the input signal:
   sampling an n-th D signal on a triggering event of an (n−1)th complementary Q signal to generate an n-th Q signal and an n-th complementary Q signal, the n-th complementary Q signal being coupled to the n-th D signal; and
   sampling the n-th Q signal on a triggering event of an (n−1)th delayed version of the reference signal to generate an n-th bit of the digital representation of the elapsed number of cycles of the input signal;
   wherein n is an index to the plurality of bits in the digital representation of the elapsed number of cycles of the input signal, and n is larger than or equal to 3.

3. The method of claim 1, the triggering event of each signal being a rising edge of the signal.

4. The method of claim 1, the first delayed version of the reference signal being delayed relative to the reference signal by a fixed delay.

5. The method of claim 1, further comprising:
   sampling a static logical signal on a triggering event of the reference signal to generate a first delayed Q signal;
   delaying the first delayed Q signal by a first predetermined delay to generate the first delayed version of the reference signal; and
   resetting the first delayed Q signal on a triggering event of a delayed version of the first delayed Q signal.

6. The method of claim 5, the static logical signal being a logical HIGH.

7. The method of claim 5, further comprising, for a plurality of bits in the digital representation of the number of cycles of the input signal, repeating the steps of:
   sampling an n-th D signal on a triggering event of an (n−1)th complementary Q signal to generate an n-th Q signal and an n-th complementary Q signal, the n-th complementary Q signal being coupled to the n-th D signal; and
   sampling the n-th Q signal on a triggering event of an (n−1)th delayed version of the reference signal to generate an n-th bit of the digital representation of the number of cycles of the input signal;
   sampling a static logical signal on a triggering event of an (n−1)th delayed Q signal to generate an n-th delayed Q signal;
   delaying the n-th delayed Q signal by an n-th predetermined delay to generate the n-th delayed version of the reference signal; and
   resetting the n-th delayed Q signal on a triggering event of a delayed version of the n-th delayed Q signal,
   wherein n is an index to the bits in the digital representation of the number of cycles of the input signal, and n is larger than or equal to 3.

8. An apparatus for generating a digital representation of a number of elapsed cycles of an input signal, the apparatus comprising:
   a first signal sampler configured to sample a first D signal on a triggering event of the input signal to generate a first Q signal and a first complementary Q signal, the first complementary Q signal being coupled to the first D signal;
   a second signal sampler configured to sample a second D signal on a triggering event of the first complementary Q signal to generate a second Q signal and a second complementary Q signal, the second complementary Q signal being coupled to the second D signal;
   a first auxiliary signal sampler configured to sample the first Q signal on a triggering event of a reference signal to generate a first bit of the digital representation of the number of elapsed cycles of the input signal; and
   a second auxiliary signal sampler configured to sample the second Q signal on a triggering event of a first delayed version of the reference signal to generate a second bit of the digital representation of the number of elapsed cycles of the input signal,
   wherein the input signal is an output signal of a digitally-controlled oscillator (DCO) in a digital phase-locked loop, the number of elapsed cycles representing the integer portion of an accumulated phase of the DCO output signal.

9. The apparatus of claim 8, each signal sampler comprising a D-Q flip-flop.

10. The apparatus of claim 8, the triggering event of each signal being a rising edge of the signal.

11. The apparatus of claim 8, further comprising:
   an n-th signal sampler configured to sample an n-th D signal on a triggering event of an (n−1)th complementary Q signal to generate an n-th Q signal and an n-th complementary Q signal, the n-th complementary Q signal being coupled to the n-th D signal; and
   an n-th auxiliary signal sampler configured to sample the n-th Q signal on a triggering event of an (n−1)th delayed version of the reference signal to generate an n-th bit of the digital representation of the number of cycles of the input signal;
   wherein n is an index to the bits in the digital representation of the number of elapsed cycles of the input signal, and n is larger than or equal to 3.

12. The apparatus of claim 8, the first delayed version of the reference signal being delayed relative to the reference signal by a fixed delay.

13. The apparatus of claim 8, further comprising a matched delay sampling line comprising:
   a first matched sampler configured to sample a static logical signal on a triggering event of the reference signal to generate a first delayed Q signal, the first delayed Q signal reset on a triggering event of a delayed version of the first delayed Q signal; and a first delay element for delaying the first delayed Q signal by a first predetermined delay to generate the first delayed version of the reference signal.

14. The apparatus of claim 13, the static logical signal being a logical HIGH.

15. The apparatus of claim 13, the apparatus further comprising:

an n-th signal sampler configured to sample an n-th D signal on a triggering event of an (n−1)th complementary Q signal to generate an n-th Q signal and an n-th complementary Q signal, the n-th complementary Q signal being coupled to the n-th D signal; and an n-th auxiliary signal sampler configured to sample the n-th Q signal on a triggering event of an (n−1)th delayed version of the reference signal to generate an n-th bit of the digital representation of the number of cycles of the input signal, wherein n is an index to the bits in the digital representation of the number of elapsed cycles of the input signal, and n is larger than or equal to 3, the matched delay line further comprising:

an (n−1)th delay line sampler configured to sample a static logical signal on a triggering event of an (n−1)th delayed Q signal to generate an n-th delayed Q signal, the n-th delayed Q signal reset on a triggering event of a delayed version of the n-th delayed Q signal; and an (n−1)th delay element delaying the n-th delayed Q signal by an n-th predetermined delay to generate the n-th delayed version of the reference signal.

16. A non-transitory computer readable storage medium having stored thereon processor-executable software instructions configured to cause a processor to perform operations for generating a digital representation of a number of elapsed cycles of an input signal, comprising:

sampling a first D signal on a triggering event of the input signal to generate a first Q signal and a first complementary Q signal, the first complementary Q signal being coupled to the first D signal;

sampling a second D signal on a triggering event of the first complementary Q signal to generate a second Q signal and a second complementary Q signal, the second complementary Q signal being coupled to the second D signal;

sampling the first Q signal on a triggering event of a reference signal to generate a first bit of the digital representation of the number of elapsed cycles of the input signal; and sampling the second Q signal on a triggering event of a first delayed version of the reference signal to generate a second bit of the digital representation of the number of elapsed cycles of the input signal, wherein the input signal is an output signal of a digitally-controlled oscillator (DCO) in a digital phase-locked loop, the number of elapsed cycles representing the integer portion of an accumulated phase of the DCO output signal.

17. The non-transitory computer readable storage medium of claim 16, wherein the stored processor-executable software instructions are configured to cause the processor to perform operations further comprising:

sampling an n-th D signal on a triggering event of an (n−1)th complementary Q signal to generate an n-th Q signal and an n-th complementary Q signal, the n-th complementary Q signal being coupled to the n-th D signal; and sampling the n-th Q signal on a triggering event of an (n−1)th delayed version of the reference signal to generate an n-th bit of the digital representation of the elapsed number of cycles of the input signal;

wherein n is an index to a plurality of bits in the digital representation of the elapsed number of cycles of the input signal, and n is larger than or equal to 3.

18. The non-transitory computer readable storage medium of claim 16, wherein the triggering event of each signal is a rising edge of the signal.

19. The non-transitory computer readable storage medium of claim 16, wherein the first delayed version of the reference signal is delayed relative to the reference signal by a fixed delay.

20. The non-transitory computer readable storage medium of claim 16, wherein the stored processor-executable software instructions are configured to cause the processor to perform operations further comprising:

sampling a static logical signal on a triggering event of the reference signal to generate a first delayed Q signal;

delaying the first delayed Q signal by a first predetermined delay to generate the first delayed version of the reference signal; and resetting the first delayed Q signal on a triggering event of a delayed version of the first delayed Q signal.

21. The non-transitory computer readable storage medium of claim 20, wherein the static logical signal is a logical HIGH.

22. The non-transitory computer readable storage medium of claim 20, wherein the stored processor-executable software instructions are configured to cause the processor to perform operations further comprising:

repeating, for a plurality of bits in the digital representation of the number of cycles of the input signal, the steps of:

sampling an n-th D signal on a triggering event of an (n−1)th complementary Q signal to generate an n-th Q signal and an n-th complementary Q signal, the n-th complementary Q signal being coupled to the n-th D signal; and sampling the n-th Q signal on a triggering event of an (n−1)th delayed version of the reference signal to generate an n-th bit of the digital representation of the number of cycles of the input signal;

sampling a static logical signal on a triggering event of an (n−1)th delayed Q signal to generate an n-th delayed Q signal;

delaying the n-th delayed Q signal by an n-th predetermined delay to generate the n-th delayed version of the reference signal; and resetting the n-th delayed Q signal on a triggering event of a delayed version of the n-th delayed Q signal, wherein n is an index to the plurality bits in the digital representation of the number of cycles of the input signal, and n is larger than or equal to 3.

23. An apparatus for generating a digital representation of a number of elapsed cycles of an input signal, the apparatus comprising:

means for sampling a first D signal on a triggering event of the input signal to generate a first Q signal and a first complementary Q signal, the first complementary Q signal being coupled to the first D signal;

means for sampling a second D signal on a triggering event of the first complementary Q signal to generate a second Q signal and a second complementary Q signal, the second complementary Q signal being coupled to the second D signal;

means for sampling the first Q signal on a triggering event of a reference signal to generate a first bit of the digital representation of the number of elapsed cycles of the input signal; and means for sampling the second Q signal on a triggering event of a first delayed version of the reference signal to generate a second bit of the digital representation of the number of elapsed cycles of the input signal, wherein the input signal is an output signal of a digitally-controlled oscillator (DCO) in a digital phase-locked loop, the number of elapsed cycles representing the integer portion of an accumulated phase of the DCO output signal.

24. The apparatus of claim 23, wherein means for sampling a first D signal on a triggering event of the input signal to generate a first Q signal and a first complementary Q signal comprises means for sampling the first D signal on a rising edge of the input signal to generate a first Q signal and a first complementary Q signal.

25. The apparatus of claim 23, wherein means for sampling the second Q signal on a triggering event of a first delayed version of the reference signal to generate a second bit of the digital representation of the number of elapsed cycles of the input signal comprises means for sampling the second Q signal on a triggering event of a first delayed version of the reference signal that is delayed relative to the reference signal by a fixed delay to generate a second bit of the digital representation of the number of elapsed cycles of the input signal.

26. The apparatus of claim 23, further comprising:

means for sampling a static logical signal on a triggering event of the reference signal to generate a first delayed Q signal;

means for delaying the first delayed Q signal by a first predetermined delay to generate the first delayed version of the reference signal; and means for resetting the first delayed Q signal on a triggering event of a delayed version of the first delayed Q signal.

27. The apparatus of claim 26, wherein means for sampling a static logical signal on a triggering event of the reference signal to generate a first delayed Q signal comprises means for sampling a logical HIGH on a triggering event of the reference signal to generate a first delayed Q signal.

28. The apparatus of claim 23, further comprising:

means for sampling an n-th D signal on a triggering event of an (n−1)th complementary Q signal to generate an n-th Q signal and an n-th complementary Q signal, the n-th complementary Q signal being coupled to the n-th D signal;

means for sampling the n-th Q signal on a triggering event of an (n−1)th delayed version of the reference signal to generate an n-th bit of the digital representation of the elapsed number of cycles of the input signal; and means for repeating operations of sampling the n-th D signal and sampling the n-th Q signal for a plurality of bits in the digital representation of the number of cycles of the input signal, wherein n is an index to the plurality of bits in the digital representation of the elapsed number of cycles of the input signal, and n is larger than or equal to 3.

29. The apparatus of claim 23, further comprising:

means for sampling an n-th D signal on a triggering event of an (n−1)th complementary Q signal to generate an n-th Q signal and an n-th complementary Q signal, the n-th complementary Q signal being coupled to the n-th D signal;

means for sampling the n-th Q signal on a triggering event of an (n−1)th delayed version of the reference signal to generate an n-th bit of the digital representation of the number of cycles of the input signal;

means for sampling a static logical signal on a triggering event of an (n−1)th delayed Q signal to generate an n-th delayed Q signal;

means for delaying the n-th delayed Q signal by an n-th predetermined delay to generate the n-th delayed version of the reference signal;

means for resetting the n-th delayed Q signal on a triggering event of a delayed version of the n-th delayed Q signal; and means for repeating operations of sampling the n-th D signal, sampling the n-th Q signal, sampling the static logical signal, delaying the n-th delayed Q signal, and resetting the n-th delayed Q signal for a plurality of bits in the digital representation of the number of cycles of the input signal, wherein n is an index to the plurality of bits in the digital representation of the elapsed number of cycles of the input signal, and n is larger than or equal to 3.

* * * * *